(12) United States Patent
Jinka et al.

(10) Patent No.: US 11,177,428 B2
(45) Date of Patent: Nov. 16, 2021

(54) FLUX-BIASING SUPERCONDUCTING QUANTUM PROCESSORS

(71) Applicant: International Business Machines Corporation, Armonk, NY (US)

(72) Inventors: Oblesh Jinka, Stamford, CT (US); Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/839,942

(22) Filed: Apr. 3, 2020

(65) Prior Publication Data
US 2020/0235277 A1      Jul. 23, 2020

Related U.S. Application Data

(60) Division of application No. 16/160,634, filed on Oct. 15, 2018, now Pat. No. 10,700,257, and a continuation of application No. 16/741,074, filed on Jan. 13, 2020, now Pat. No. 11,050,010.

(51) Int. Cl.
| | |
|---|---|
| *H01L 39/24* | (2006.01) |
| *G06N 10/00* | (2019.01) |
| *H01L 39/02* | (2006.01) |
| *H01L 39/04* | (2006.01) |
| *H01L 39/22* | (2006.01) |

(52) U.S. Cl.
CPC ......... *H01L 39/2493* (2013.01); *G06N 10/00* (2019.01); *H01L 39/025* (2013.01); *H01L 39/045* (2013.01); *H01L 39/223* (2013.01)

(58) Field of Classification Search
CPC . H01L 39/2493; H01L 39/025; H01L 39/045; H01L 39/223
See application file for complete search history.

(56) References Cited

U.S. PATENT DOCUMENTS

| | | | |
|---|---|---|---|
| 10,452,991 B1* | 10/2019 | Ganzhorn | ...... H03K 19/017545 |
| 2011/0057169 A1* | 3/2011 | Harris | ...................... H01L 27/18 257/31 |
| 2014/0235450 A1* | 8/2014 | Chow | ...................... H01L 39/00 505/170 |
| 2018/0054201 A1* | 2/2018 | Reagor | ................ H03K 19/195 |

OTHER PUBLICATIONS

NPL, "Realizing quantum gates and algorithms with three superconducting qubits" by Mathias Baur, published on 2012 in ETH Zürich (Year: 2012).*
List of all IBM related dockets, 2020.

* cited by examiner

*Primary Examiner* — Farun Lu
(74) *Attorney, Agent, or Firm* — Garg Law Firm, PLLC; Rakesh Garg; Douglas Pearson

(57) ABSTRACT

A flux-biasing device includes a set of magnetic flux generating members. A first magnetic flux generating member is configured to magnetically interact with a first qubit from a set of qubits of a quantum processor such that a first magnetic flux of the first member causes a first change in a first resonance frequency of the first qubit by a first frequency shift value. Each non-corresponding magnetic flux generating member of the set is well separated from qubits corresponding to other magnetic flux generating members of the set such that qubits corresponding to other members exhibit less than a threshold value of resonance frequency shift as a result of a magnetic flux of a non-corresponding member.

18 Claims, 17 Drawing Sheets

FLUX-BIASING SUPERCONDUCTING QUANTUM PROCESSORS

TECHNICAL FIELD

The present invention relates generally to a device, a fabrication method, and fabrication system for adjusting the resonance frequencies in quantum processors. More particularly, the present invention relates to a device, method, and system for flux biasing in superconducting quantum processors.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (Q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines Corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit. Any reference to the term "qubit" is a reference to a superconducting qubit oscillator circuitry that employs a Josephson junction unless expressly distinguished where used.

The information processed by qubits is carried or transmitted in the form of microwave signals/photons in the range of microwave frequencies. The microwave frequency of a qubit output is determined by the resonance frequency of the qubit. The microwave signals are captured, processed, and analyzed to decipher the quantum information encoded therein. A readout circuit is a circuit coupled with the qubit to capture, read, and measure the quantum state of the qubit. An output of the readout circuit is information usable by a Q-processor to perform computations.

A superconducting qubit has two quantum states—|0> and |1>. These two states may be two energy states of atoms, for example, the ground (|0>) and first excited state (|1>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states is allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

The illustrative embodiments recognize that a qubit's resonance frequency is inherently fixed at the time the qubit is fabricated, i.e., when the Josephson Junction and the capacitive element of the qubit-oscillator are fabricated on a Q-processor chip. The illustrative embodiments further recognize that in the simplest implementation of a quantum processor (Q-processor), at least two qubits are needed to implement a quantum logic gate (Q-gate). Therefore, a Q-processor chip is typically fabricated to have at least 2, but often 8, 16, or more qubits on a single Q-processor chip.

Some qubits are fixed-frequency qubits, i.e., their resonance frequencies are not changeable. Other qubits are frequency-tunable qubits. A Q-processor can employ fixed-frequency qubits, frequency-tunable qubits, or a combination thereof.

The illustrative embodiments recognize that it is difficult to fabricate single-junction transmons or fixed-frequency superconducting qubits with specific accurate frequencies or accurate frequency differences between neighboring qubits. This is mainly because the critical current of Josephson junctions is not a well-controlled parameter in the fabrication process. This results in a relatively wide-spread in the critical currents of Josephson junctions having the same design and area and fabricated on the same chip.

The illustrative embodiments recognize that when the resonance frequencies of two neighboring coupled qubits on a chip are the same or within a threshold band of frequencies or their higher transition frequencies are on resonance or close to resonance, then negative effects can happen such as, crosstalk, quantum decoherence, energy decay, creation of mixed states, unintended information transfer, quantum state leakage and so on. Having such qubits can also negatively affect the performance or utility of certain quantum gates such as cross-resonance gates which have stringent requirements on the spectrum of resonance frequencies of qubits upon which the gate is operating on. Therefore, the illustrative embodiments recognize that one challenge in quantum processors that are based on coupled fixed-frequency qubits is frequency crowding or frequency collision between adjacent qubits, in particular, when cross-resonance gates are used.

It is important to note that while the proposed flux-biasing technique is motivated by the need to solve frequency collisions of coupled qubits on the same chip which are acted on with cross-resonance gates, the proposed flux-biasing technique is general, and can be applied to other kinds of quantum devices on chip which require relatively high-density flux biasing without penetrating the device package.

The illustrative embodiments recognize that a frequency-tunable qubit (hereinafter compactly referred to as a "tunable qubit") has a flux-dependent inductance, consisting of a superconducting loop that includes one or more Josephson junctions. By varying the magnetic field threading the loop, the inductance of the loop changes, which in turn changes the resonance frequency of the qubit, thus making the qubit tunable. The illustrative embodiments recognize that one challenge in quantum processors that are based on tunable-frequency qubits is sensitivity to flux noise which leads to dephasing.

Presently, when the frequency of a flux-tunable qubit on a chip has to be changed, there are two main methods that are used in the state-of-the-art to apply or change the flux threading the loop of the qubit. The first method is using a global superconducting coil attached to the qubit-chip package. This method has the advantage of having an external fully controllable magnetic source which does not penetrate the device package. Such an external source can be filtered well and avoids several negative affects of having magnetic field lines inside of the package and near the quantum chip such as, crosstalk, power leakage, noise penetration. The disadvantage of this method is that the qubits cannot be individually controlled and tuned. The second method is using on-chip magnetic field lines or flux-lines that are placed on a different layer or printed circuit board that are near the qubit chip. The advantages of this method are: 1—it is scalable, 2—enables high-density flux-line systems for large quantum processors, 3—allows individual qubits to be tuned and controlled. The disadvantages of this method are: 1—it introduces many possible noise channels between the quantum processor and the external environment which can negatively affect the coherence and performance of the quantum processors, 2—it is difficult to fabricate and route the on-chip flux-lines or magnetic field lines that are near the qubits on different layers or on printed circuit boards inside the device package.

SUMMARY

The illustrative embodiments provide a superconducting device, a method and system of fabrication therefore. A superconducting flux-biasing device of an embodiment includes a plurality of magnetic flux generating members (member), wherein a first member of the plurality of members is configured to magnetically interact with a first qubit in a plurality of qubits of a quantum processor such that a first magnetic flux of the first member causes a first change in a first resonance frequency of the first qubit by a first frequency shift value, and each non-corresponding member of the plurality of members is at a distance from qubits corresponding to other members of the plurality of members such that qubits corresponding to other members exhibit less than a threshold value of resonance frequency shift as a result of a magnetic flux of a non-corresponding member.

Another embodiment further includes a structure on which the plurality of members is fabricated, the structure being distinct from a chip on which the quantum processor is fabricated; a fastening mechanism to fasten the structure to a housing of the quantum processor, wherein the fastening mechanism disposes the first member within an influence distance of the first qubit, wherein the influence distance causes the first frequency shift value to be greater than the threshold value.

In another embodiment, the first member is separated from the first qubit by a first gap, the gap being occupied by partial vacuum.

Another embodiment further includes a first wrapping encasing the first member, wherein the first wrapping comprises an electrical insulator.

Another embodiment further includes a wire of a superconducting material, the wire being formed into a coil around a conductive core, the coiled wire and the core together forming the first member, the first member being configured to produce the first magnetic flux when supplied with a direct current.

In another embodiment, the first member produces the first magnetic flux while operating in a range of temperatures between 4 degrees Kelvin and 0.0001 degrees Kelvin.

Another embodiment further includes an orientation of the first member relative to the first qubit, wherein the orientation comprises positioning the first member with a cylindrical axis of the first member being orthogonal to a plane of fabrication of the first qubit, with the first member is situated below the plane of fabrication.

Another embodiment further includes an orientation of the first member relative to the first qubit, wherein the orientation comprises positioning the first member with a cylindrical axis of the first member being orthogonal to a plane of fabrication of the first qubit, with the first member is situated above the plane of fabrication.

Another embodiment further includes an orientation of the first member relative to the first qubit, wherein the orientation comprises positioning the first member with a cylindrical axis of the first member being at a non-orthogonal angle to a plane of fabrication of the first qubit, with the first member is situated below the plane of fabrication.

Another embodiment further includes a one-to-one correspondence between the first member and the first qubit.

Another embodiment further includes an n-to-one correspondence between more than one members of the plurality of members and the first qubit.

Another embodiment further includes a second member of the plurality of members is configured to magnetically interact with the second qubit in the plurality of qubits of the quantum processor such that a second magnetic flux of the second member causes a second change in a second resonance frequency of the second qubit by a second frequency shift value, and wherein the second member is at a distance from the first qubit such that the first qubit exhibits less than the threshold value of resonance frequency shift as a result of the second magnetic flux.

Another embodiment further includes a pair of connectors coupled to the first member, wherein changing a value of a direct current passing through the pair of connectors causes a corresponding change in the first frequency shift value of the first qubit.

Another embodiment further includes a first number of coil turns in the first member; a second number of coil turns in a second member of the plurality of members, wherein the second member causes a second frequency shift value in a second qubit corresponding to the second member as compared to the first frequency shift value in the first qubit when a first value of direct current is passed through the first member and the second member.

In another embodiment, the plurality of members is positioned outside a housing that contains the plurality of qubits, and wherein the plurality of members are removable via one cover of the housing.

In another embodiment, the plurality of members is thermalized to a dilution fridge stage through a housing that contains the plurality of qubits.

In another embodiment, a cylindrical axis of each member is aligned with a center of a resonance loop of a corresponding qubit from the plurality of qubits.

Another embodiment further includes a filtering circuit fabricated in conjunction with the plurality of members, wherein the filtering circuit filters an electrical effect of the plurality of members.

BRIEF DESCRIPTION OF THE DRAWINGS

The novel features believed characteristics of the invention are set forth in the appended claims. The invention itself, however, as well as a preferred mode of use, further objectives, and advantages thereof, will best be understood by reference to the following detailed description of the illustrative embodiments when read in conjunction with the accompanying drawings, wherein:

DETAILED DESCRIPTION

Figure 1:
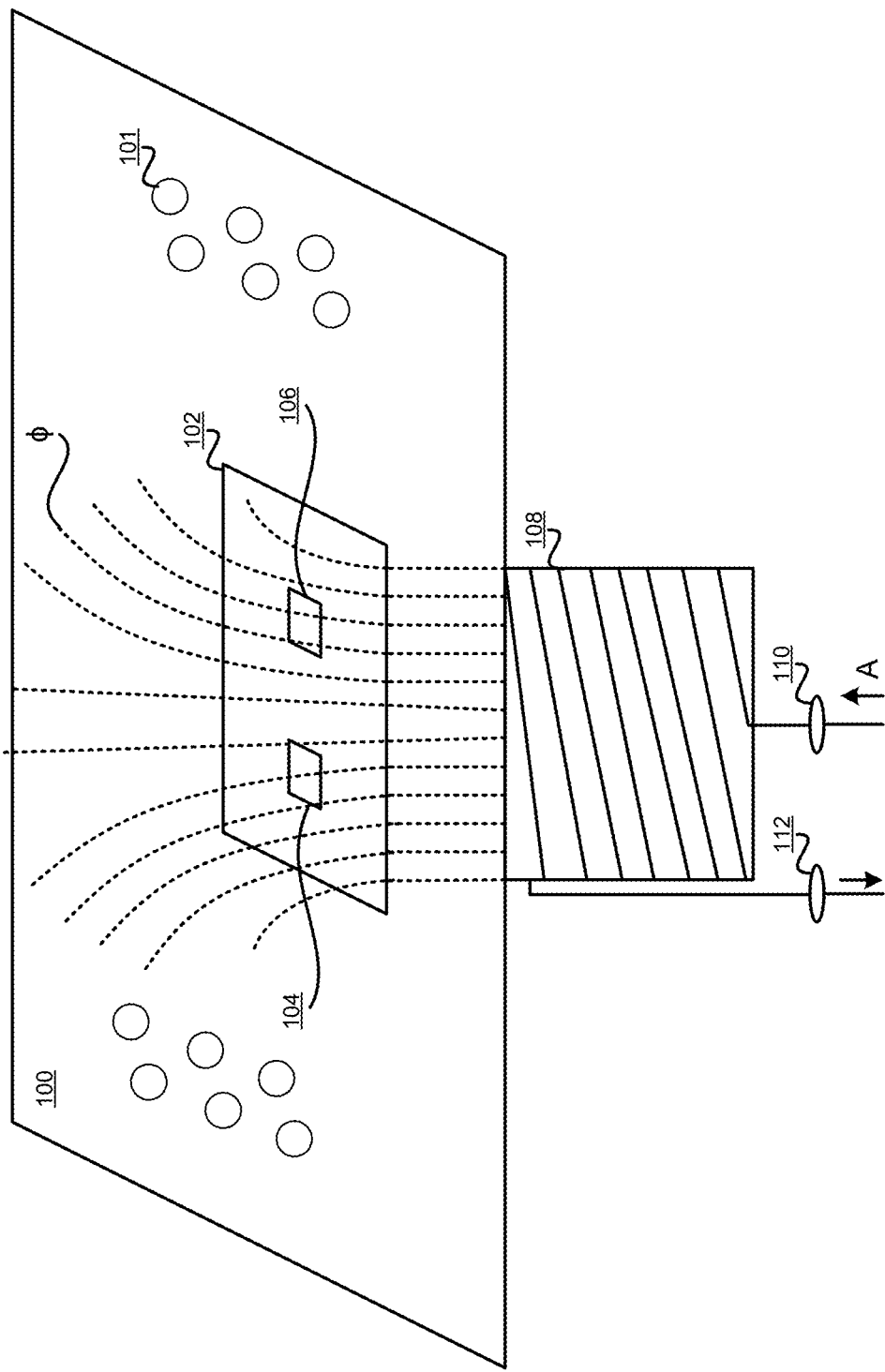
FIG. 1 depicts a block diagram of an example configuration of a prior-art of a global superconducting magnetic coil which can be improved in accordance with an illustrative embodiment.

The illustrative embodiments used to describe the invention generally address and solve the above-described needs for individually tunable qubits on a single chip. The illustrative embodiments provide a method and apparatus for flux biasing in superconducting quantum processors.

An operation described herein as occurring with respect to a frequency or frequencies should be interpreted as occurring with respect to a signal of that frequency or frequencies. All references to a "signal" are references to a microwave signal unless expressly distinguished where used.

An embodiment provides a configuration of an apparatus for flux biasing in superconducting quantum processors. Another embodiment provides a fabrication method for the apparatus for flux biasing in superconducting quantum processors, such that the method can be implemented as a software application. The application implementing a fabrication method embodiment can be configured to operate in conjunction with an existing superconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example qubits, magnetic coils or magnetic flux inducing structures, housing, casing, and other circuit components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a function in a described manner, and such adaptations are contemplated within the scope of the illustrative embodiments.

The illustrative embodiments are described with respect to certain types of materials, electrical properties, steps, shapes, sizes, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of a prior-art of a global superconducting magnetic coil which can be improved in accordance with an illustrative embodiment. Printed circuit board (PCB) 100 includes microwave connectors 101, chip 102, and other components as may be needed in an implementation. Chip 102 is an example of a Q-processor comprising a plurality of qubits, e.g., qubits 104 and 106. In one embodiment, chip 102 can be mounted on printed circuit board 100 using a housing, a non-limiting example of which is described herein.

Global superconducting magnetic coil 108 is a flux inducing structure that is placed near chip 102 to provide biasing flux to all qubits on chip 102. Global superconducting magnetic coil 108 is distinct and separate from chip 102. Global superconducting magnetic coil 108 is formed by winding a superconducting wire with very thin insulating coating around a metallic core or rod, the two ends of the superconducting wire terminating at contacts 110 and 112. Electric Direct current (DC)-current A—flows through the coil to generate magnetic flux 1. Flux 1 change the output frequencies of qubits 104 and 106 by some amount. The flux dependence of the superconducting loop is periodic. The amount of flux that threads the qubit loops depend on their distances from global superconducting magnetic coil 108 and also on the background magnetic field which might be unequal for the different qubits. Generally, once the position of global superconducting magnetic coil 108 is fixed relative to chip 102, and the magnetic environment of chip 102 is stabilized in an installation, the changes in the frequencies of qubits 104 and 106 on chip 102 cannot be tuned independently of each other using a global superconducting magnetic coil 108.

Figure 2:
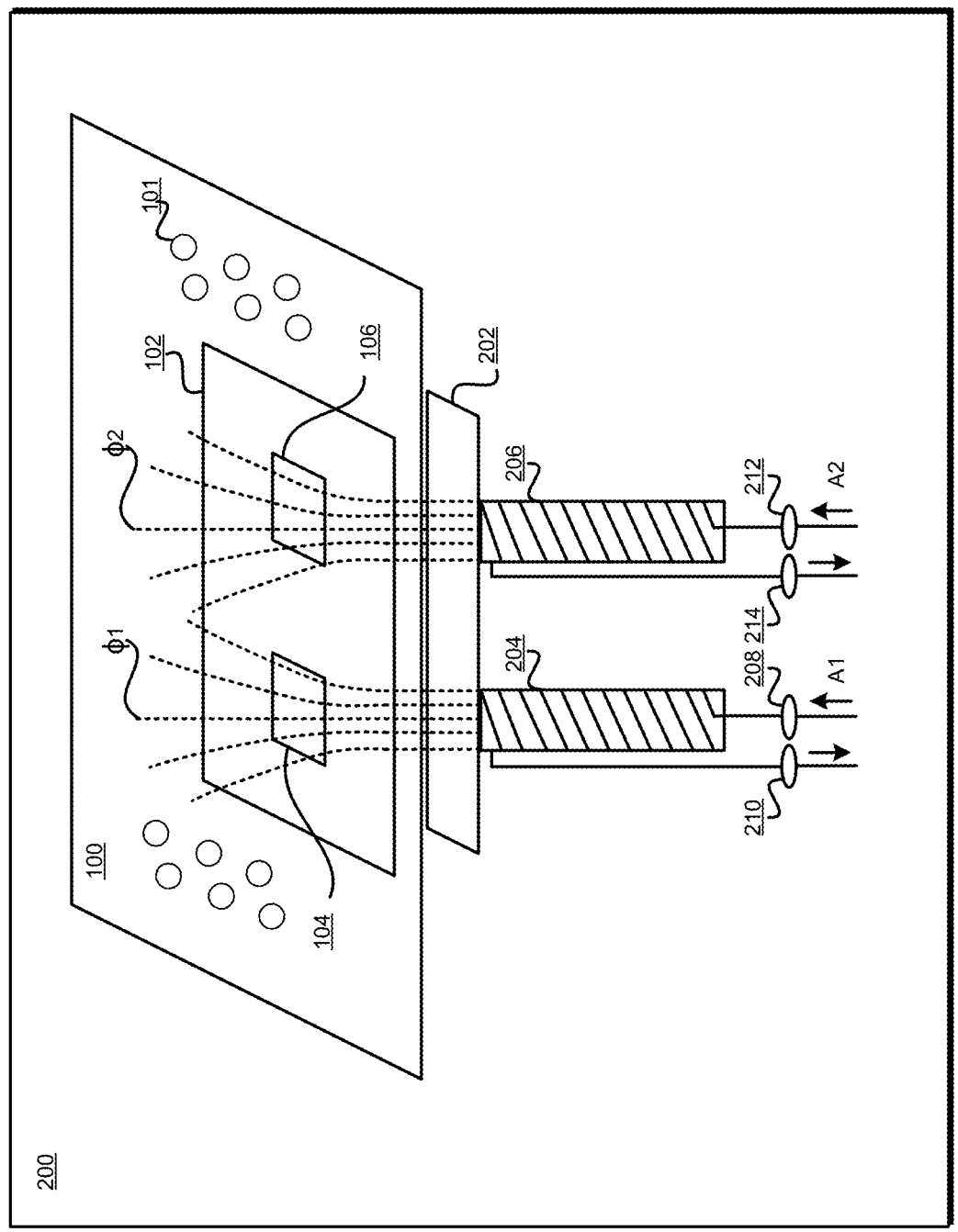
FIG. 2 depicts a block diagram of an example configuration of an apparatus for flux biasing in superconducting quantum processors in accordance with an illustrative embodiment.

With reference to FIG. 2, this figure depicts a block diagram of an example configuration of an apparatus for flux biasing in superconducting quantum processors in accordance with an illustrative embodiment. Chip 102 including qubits 104 and 106 is reused from FIG. 1.

In contrast with global superconducting magnetic coil 108 of FIG. 1, configuration 200 of FIG. 2 depicts a separate magnetic coil for an individual qubit on chip 102. For example, coil 204 flux biases qubit 104 (and therefore is associated with qubit 104) and coil 206 flux biases qubit 106 (and therefore is associated with qubit 106). Hereinafter, the pair of a qubit-specific coil and the corresponding qubit is referred to as an "L-Q pair". An embodiment forms and positions such a qubit-specific coil relative to the corresponding qubit in such a manner that the magnetic field lines from the qubit-specific coil interact mainly with the corresponding qubit and any magnetic interference with adjacent qubits is maintained within an acceptable tolerance limit.

Generally, a magnetic coil generates magnetic flux, which pass through—or threads—the superconducting loop of a qubit—which includes the inductance of a Josephson junction. The flux threading through the loop of the qubit causes a change in the inductance of the Josephson junction, which in turn results in a change in the resonance frequency of the qubit loop. Operating in this manner, coil 204 only interacts with qubit 104 in a manner to cause a substantial (greater than the threshold) amount of change or shift in qubit 104's frequency. Coil 206 operates relative to qubit 106 in a similar manner. Coil 204 preferably does not cause any shift in qubit 106's frequency, or any such shift is negligible compared to the frequency spectrum of qubits in quantum processors. Coil 206 behaves in a similar manner relative to qubit 104.

Furthermore, each qubit-specific coil is optionally mounted on platform 202, which is a separate removable platform, e.g., a separate PCB. Platform 202 is usable to position each qubit-specific coil relative to chip 102 in a movable manner, removable manner, or both. For example, in one embodiment, one qubit-specific coil may be moved or repositioned relative to a corresponding qubit, e.g., for improving the magnetic interaction with a corresponding qubit, reducing undesirable interference with a non-corresponding qubit, or some combination of these and other objectives.

Change in the magnitude of the magnetic field threading the superconducting Josephson loop changes the flux threading that loop. For example, in the depicted non-limiting example orientation, coil 204 may be moved or repositioned away from qubit 106 while still keeping qubit 104 within the magnetic field lines of flux $\Phi 1$. Similarly, coil 206 may be moved or repositioned away from qubit 104 while still keeping qubit 106 within the magnetic field lines of flux 12.

In another example embodiment, in the depicted non-limiting example orientation, coil 204 may be moved closer to qubit 104 along coil 204's cylindrical axis to reduce a gap between coil 204 and qubit 104, resulting in a stronger magnetic coupling between coil 204 and qubit 104. Conversely, coil 206 may be moved farther from qubit 106 along coil 206's cylindrical axis to increase a gap between coil 206 and qubit 106, resulting in a weaker magnetic coupling between coil 206 and qubit 106.

The depicted orientation of FIG. 2, which shows the qubit-specific coils 204-206 positioned below qubits 104-106, respectively, is a preferred orientation but is not intended to be limiting. As will become apparent from this disclosure, a qubit-specific coil can be oriented relative to the corresponding qubit in other orientations as well to achieve the qubit-specific frequency shifting effect on corresponding qubits. Different orientations yield different amounts of fluxes ranging from significant to negligible. While some orientations might be useful in presently available superconducting q-processor implementations, other orientations might find utility in other potential quantum devices which employ non-superconducting qubits with on-chip planar loops.

Furthermore, in one embodiment, the magnetic flux of each qubit-specific coil is independently and dynamically controlled by adjusting the current supplied to the qubit-specific coil through a dedicated pair of contacts for that qubit-specific coil. For example, current A1 supplied through contacts 208-210 generates from coil 204 a magnetic field which produces flux Φ1 threading through the loop of qubit 104 and causes a change F1 in qubit 104's resonance frequency. Changing the current to A1' (not shown) will consequently generate flux Φ1' (not shown) from coil 204 and cause a different change F1' in qubit 104's resonance frequency. Qubit-specific coil 206 operates in a similar manner. current A2 supplied through contacts 212-214 generates flux Φ2 from coil 206 and causes a change F2 in qubit 106's resonance frequency. Changing the current to A2' (not shown) will consequently generate flux Φ2' (not shown) from coil 206 and cause a different change F2' in qubit 106's resonance frequency.

Without implying that any particular embodiment provides any specific advantage or property, some of the advantages or properties that may be realized from implementing an embodiment in a specific manner include but are not limited to: 1—the superconducting coils are external to the package; 2—each coil primarily flux-biases one qubit; 3—these coils are easy to thermalize within the device package and through the mounting structure; 4—these coils can be small size, if the coils are located very close to the qubits, e.g., the package has a thin wall on the coils side; 5—these coils are mounted into precise slots-pattern within the device package whose centers are aligned with the qubits center; 6—the coils are soldered or bonded to superconducting printed circuit board or multi-layer substrate; 7—the printed circuit board could consist of multiple superconducting layers carrying current to different coils without overlaps and with little interference; and 8—the coils can be filtered using filters integrated into the printed circuit board or the multi-layer substrate.

Different quantum processing applications can have different requirements for flux-biasing the qubits. In some implementations, magnetic field biasing may have to be applied perpendicularly to the plane of superconducting qubits. In some other implementations, magnetic field biasing may have to be applied in parallel to the plane of superconducting qubits or other quantum devices. Such other requirements and implementations are contemplated within the scope of the illustrative embodiments. The coils in L-Q pairs of an embodiment can be oriented differently relative to their corresponding qubits. Furthermore, in one embodiment, a coil can have a one-to-one correspondence with a qubit; in another embodiment, a coil can have a one-to-n correspondence with a plurality of qubits; in another embodiment, n coils can have an n-to one correspondence with a qubit where several coils correspond to a single qubit; in another embodiment, n coils can have an n-to-m correspondence with qubits where a set of n coils correspond to a set of m qubits. In another embodiment, a coil can have a zero-to-one correspondence with a qubit where no coil corresponds to certain qubits on a chip.

As can be seen from the variety of configurations disclosed, each qubit can be independently controlled for resonance frequency shift. Furthermore, the shift can be statically set or dynamically changed for an individual qubit on a multi-qubit chip. Additionally, qubits and coils can be oriented differently relative to one another to achieve the shifts, giving a variety of implementation alternatives in space-constrained implementations. Malfunction or maloperation in one L-Q pair can be easily identified and remedied without disturbing other L-Q pairs. All these advantages, and other features are further useful because the set of coils according to an embodiment can be implemented off-chip, i.e., not on the qubit chip itself. Some off-chip implementations are now described as non-limiting example implementations in FIGS. 3-10.

Figure 3:
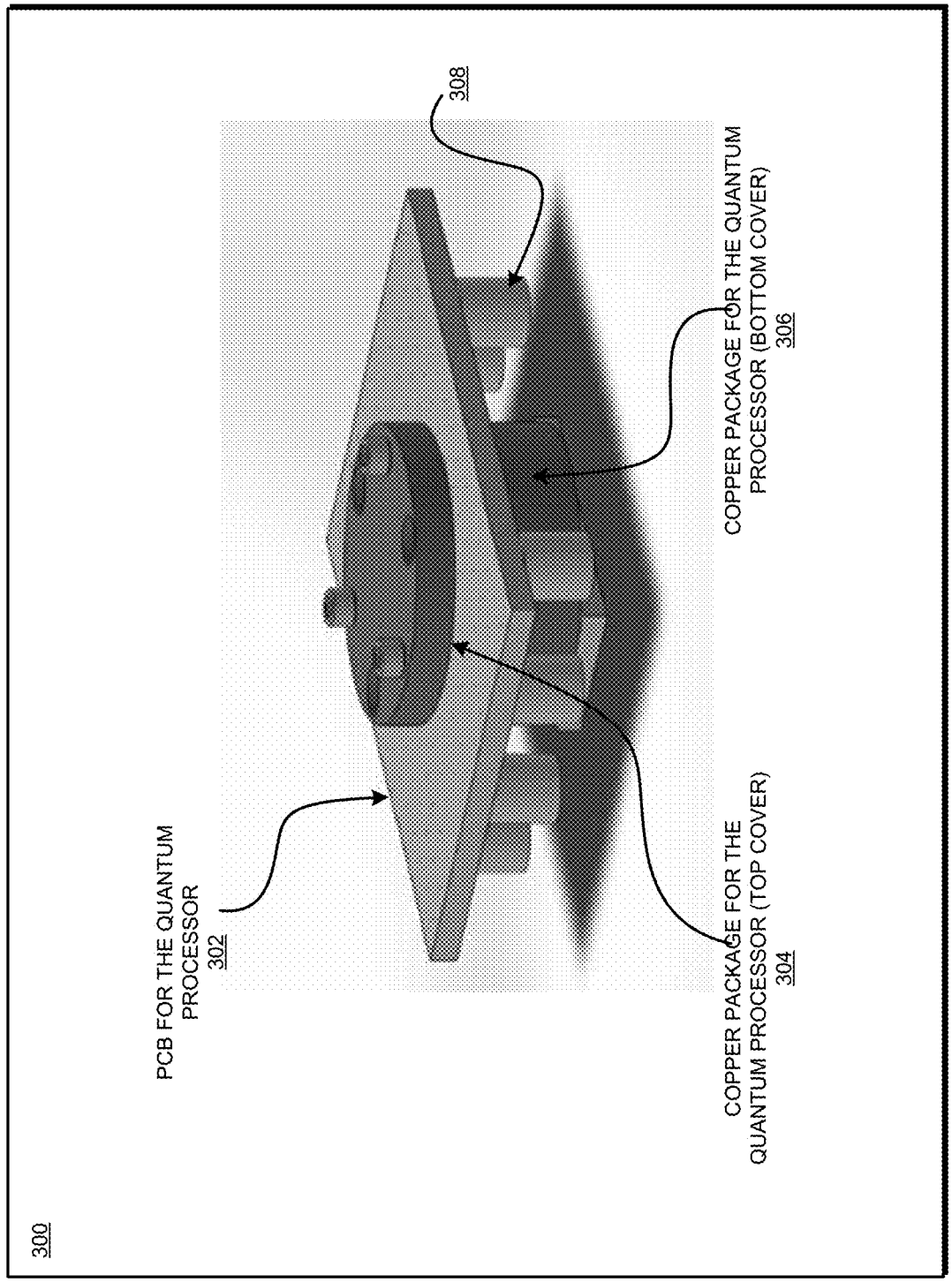
FIG. 3 depicts an example implementation of L-Q pairs for flux biasing in superconducting quantum processors in accordance with an illustrative embodiment.

With reference to FIG. 3, this figure depicts an example implementation of L-Q pairs for flux biasing in superconducting quantum processors in accordance with an illustrative embodiment. Configuration 300 depicts a presently used implementation of cryogenic q-processors. PCB 302 forms the structure onto which a housing for a Q-processor is mounted. In some implementations, the housing is fabricated from Copper due to the good electrical conductivity and good thermalization properties of the metal at cryogenic temperatures. The housing comprises top cover 304 and bottom cover 306, which together enclose a volume in which the Q-processor chip (not shown) is installed.

A set of connectors 308 is also configured on PCB 302 to couple the assembly with external circuits. Connectors 308 can be electrical couplings, microwave couplings, thermal couplings, mechanical couplings, or some combination of these and other types of couplings used in Q-processor implementations.

Figure 4:
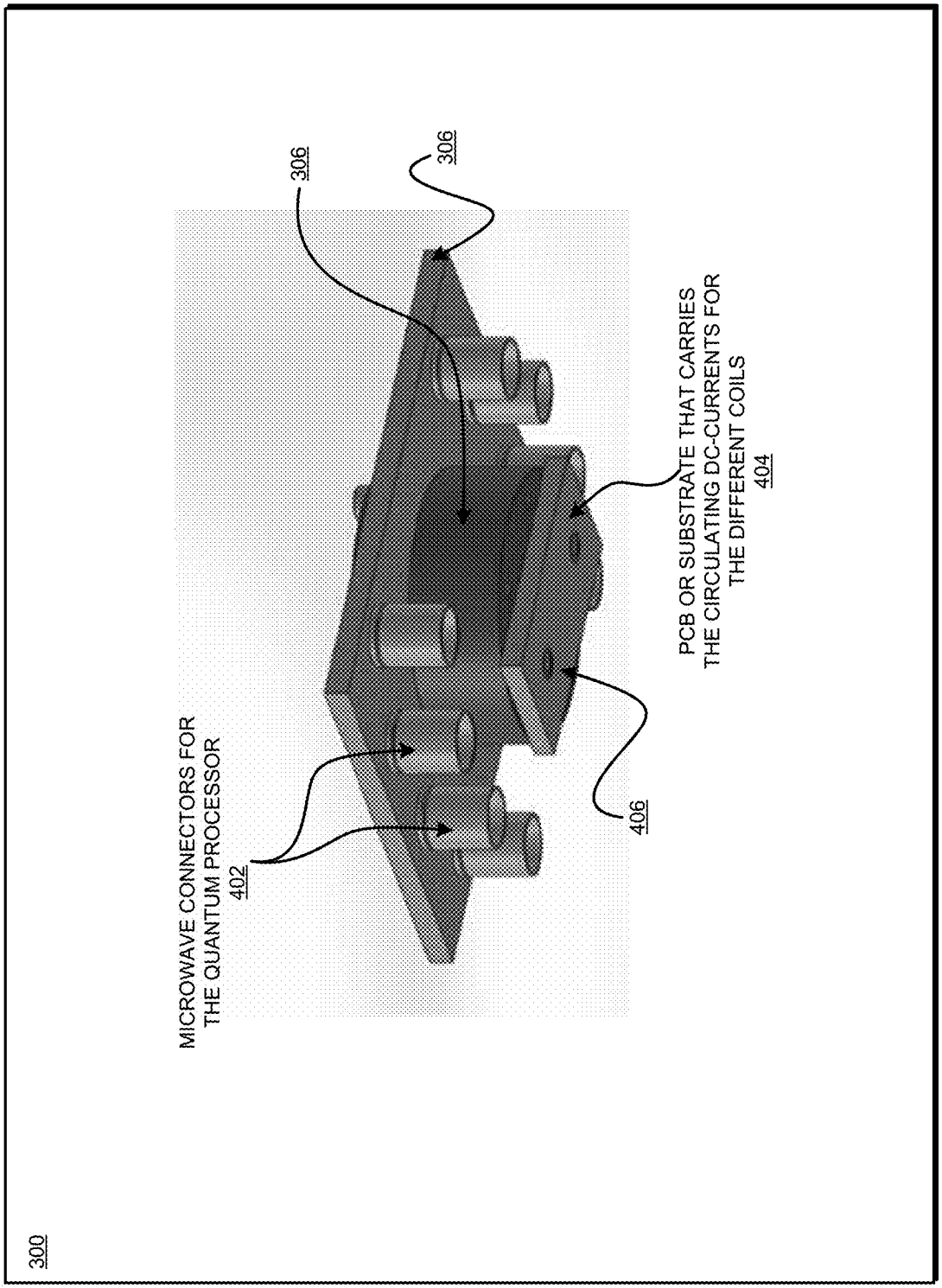
FIG. 4 depicts another view of an example implementation of L-Q pairs for flux biasing in superconducting quantum processors in accordance with an illustrative embodiment.

With reference to FIG. 4, this figure depicts another view of an example implementation of L-Q pairs for flux biasing in superconducting quantum processors in accordance with an illustrative embodiment. Another view of configuration 300 shows some example connectors 308 in the form of microwave connectors 402. A detachable platform structure that can be mounted on or through bottom cover 306 carries the coils of L-Q pairs (not visible) on the side that faces the volume inside the housing. Detachable platform structure 404 can be implemented as a second PCB. Contacts for each coil carried on structure 404 can be placed (not shown) on structure 404 (not shown). Platform structure 404 can be detachably fastened to the housing using suitable fasteners 406, e.g., screws (not shown), which fasten platform structure 404 to bottom cover 306.

Figure 5:
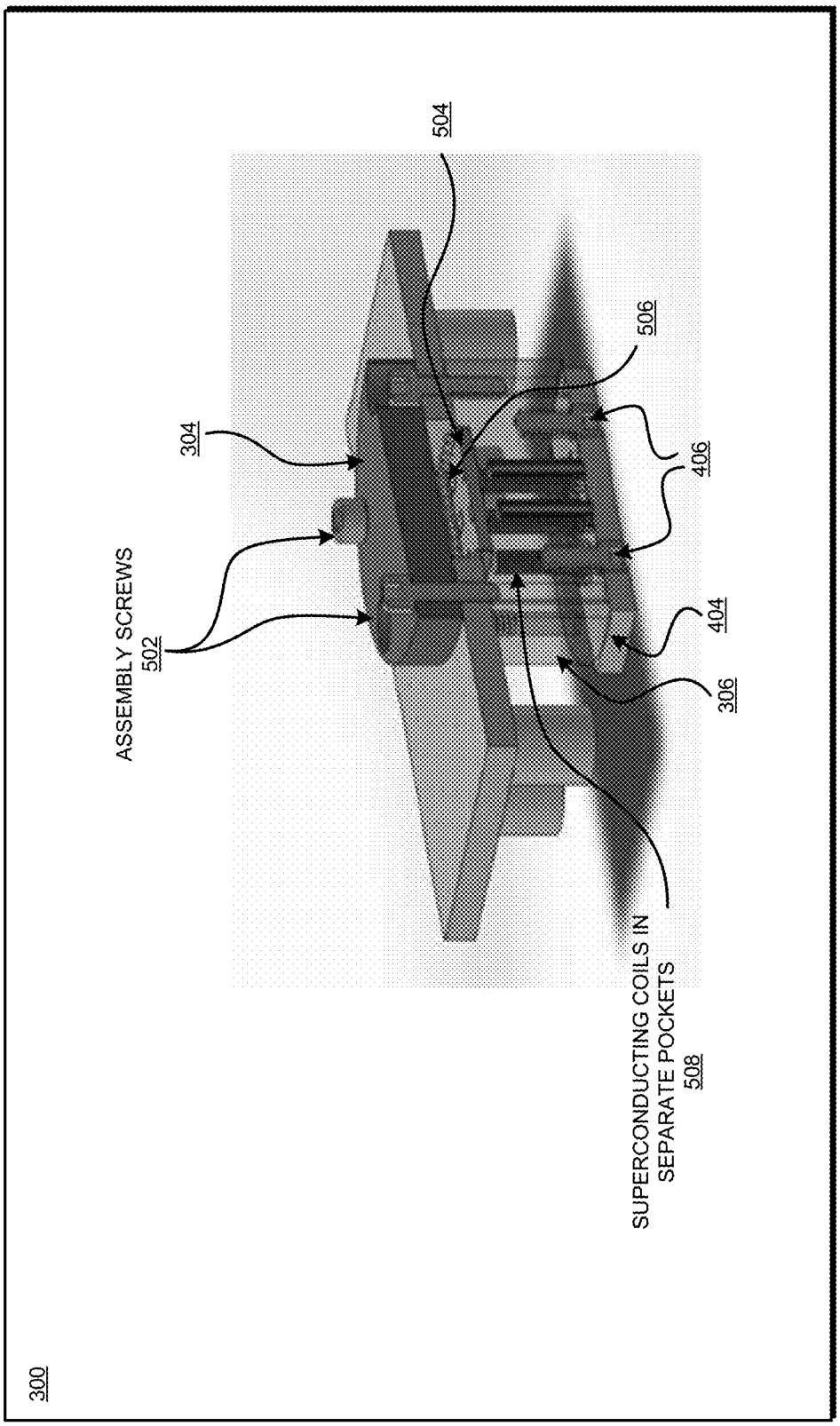
FIG. 5 depicts another view of an example implementation of L-Q pairs for flux biasing in superconducting quantum processors in accordance with an illustrative embodiment.

With reference to FIG. 5, this figure depicts another view of an example implementation of L-Q pairs for flux biasing in superconducting quantum processors in accordance with an illustrative embodiment. Another view of configuration 300 shows fasteners 502 to attach top cover 304 to bottom cover 306. Fasteners 406 attach platform structure 404 to bottom cover 306.

Individual coils of L-Q pairs correspond to qubits on Q-processor chip 504. Some qubit locations 506 are visible in the depicted view. Some coils 508 that individually correspond to qubits in locations 506 are also visible. In one embodiment, each coils 508 is a superconducting magnetic coil, configured to operate at the same or similar temperature as the corresponding qubit.

A wrapped coil is placed in sufficiently close proximity of the corresponding qubit such that the magnetic flux of the coil can interact with and alter the frequency of the qubit's resonance frequency. In one embodiment, as depicted, a wrapped coil 508 is positioned below the corresponding qubit location 506. Coils 508 are attached to detachable platform structure 404, qubits 506 are fabricated on chip 504, and the coils and the qubits of L-Q pairs interact across a medium, e.g., practically attainable vacuum, high-conductivity copper, silicon, as described herein. The conductor of a coil is terminated at a pair of contacts on or through platform structure 404. The pair of contacts of each coil can be used to flow the current through the individual coil.

Figure 6:
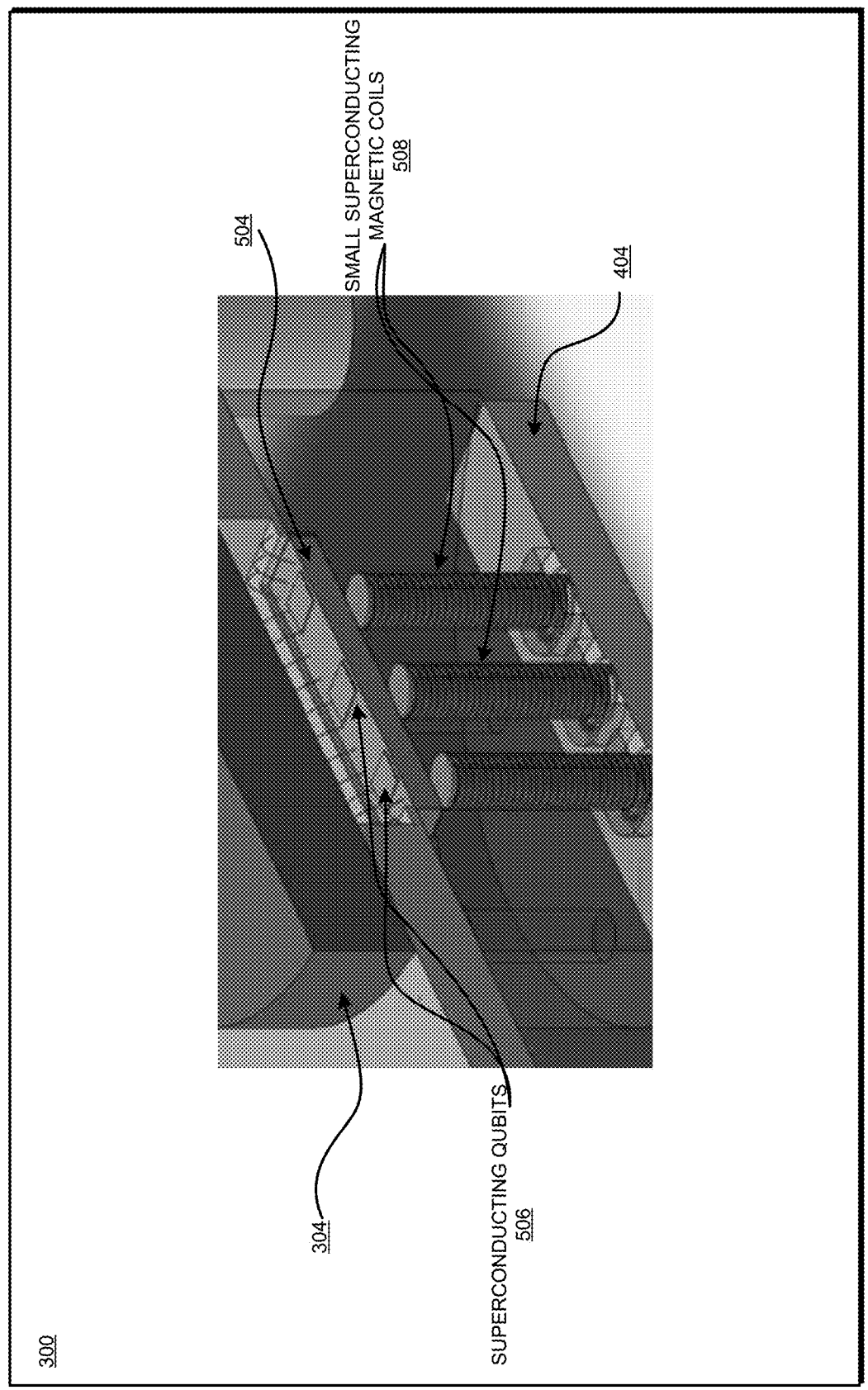
FIG. 6 depicts another view of an example implementation of L-Q pairs for flux biasing in superconducting quantum processors in accordance with an illustrative embodiment.

With reference to FIG. 6, this figure depicts another view of an example implementation of L-Q pairs for flux biasing in superconducting quantum processors in accordance with an illustrative embodiment. Another view of configuration 300 shows a non-limiting example detailed disposition of a coil 508 relative to a corresponding qubit 506.

Figure 7:
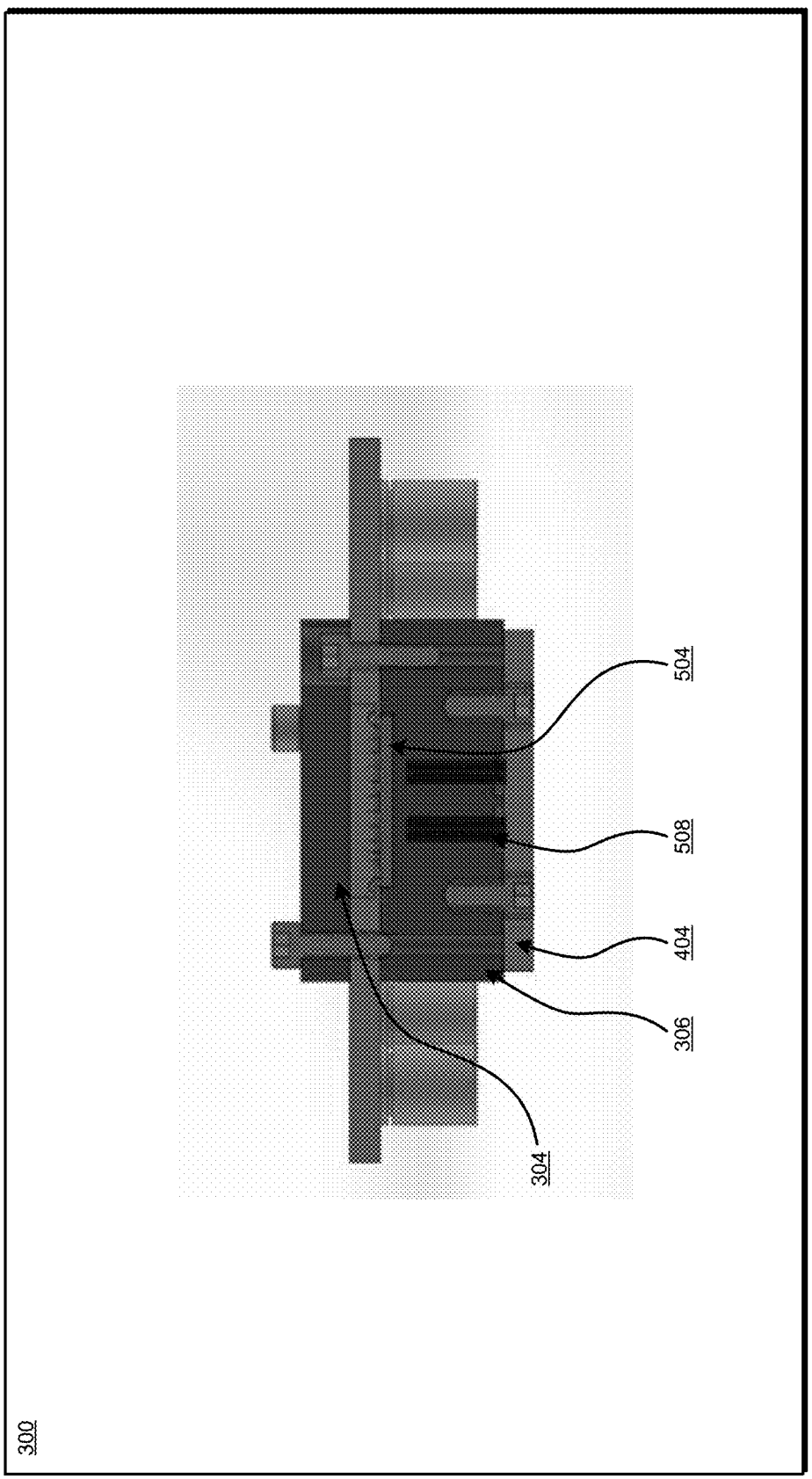
FIG. 7 depicts another view of an example implementation of L-Q pairs for flux biasing in superconducting quantum processors in accordance with an illustrative embodiment.

With reference to FIG. 7, this figure depicts another view of an example implementation of L-Q pairs for flux biasing in superconducting quantum processors in accordance with an illustrative embodiment. Another view of configuration 300 shows another non-limiting example detailed disposition of a coil 508 relative to a corresponding qubit 506 inside the housing.

Figure 8:
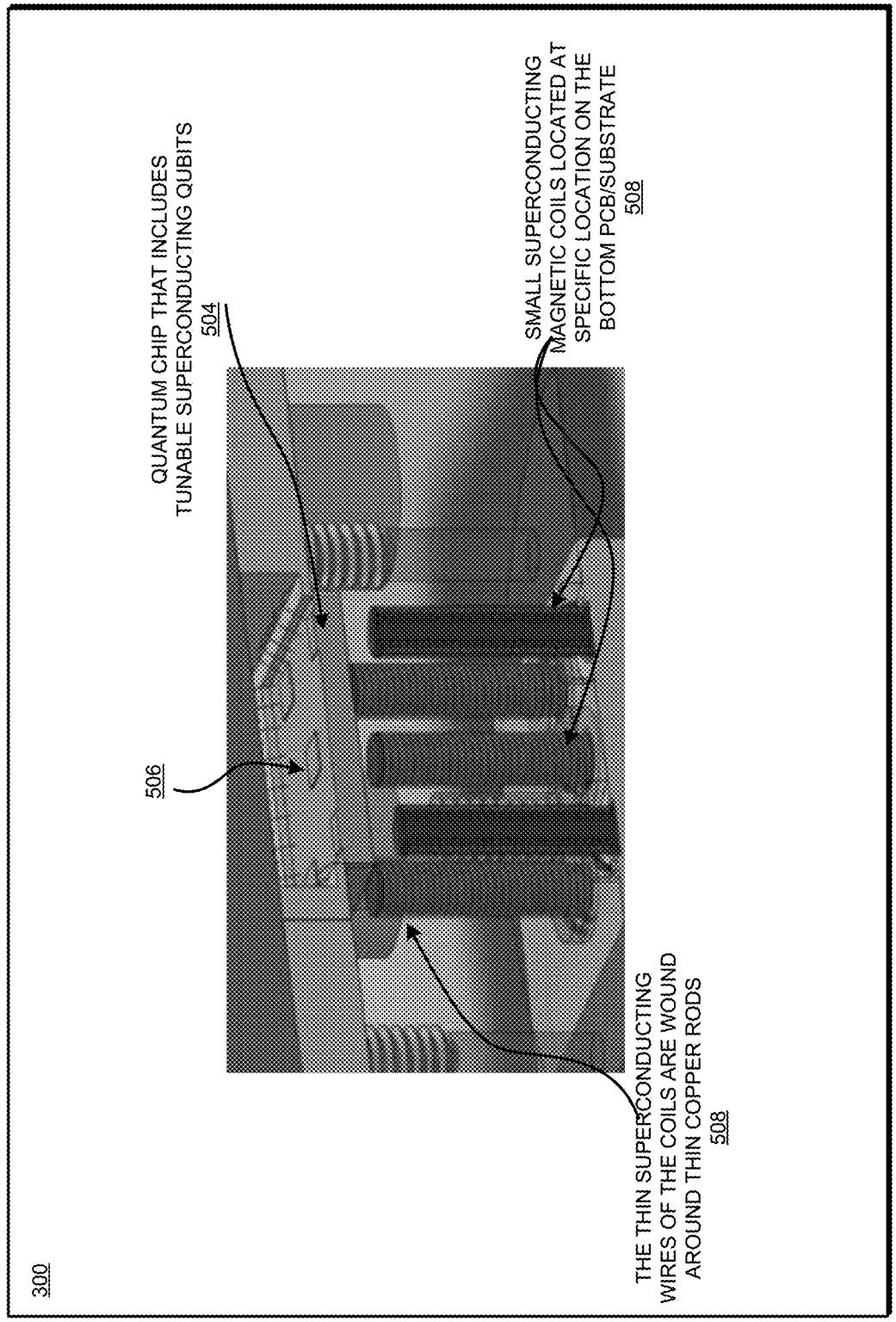
FIG. 8 depicts another view of an example implementation of L-Q pairs for flux biasing in superconducting quantum processors in accordance with an illustrative embodiment.

With reference to FIG. 8, this figure depicts another view of an example implementation of L-Q pairs for flux biasing in superconducting quantum processors in accordance with an illustrative embodiment. Another view of configuration 300 shows another non-limiting example detailed disposition of a coil 508 relative to a corresponding qubit 506 inside the housing. In one embodiment, coil 508 is formed by wrapping a thinly insulated superconducting wire around a conductive metal core, e.g., an oxygen-free high conductivity copper rod. An insulator wrapping around coil 508 is optional.

Figure 9:
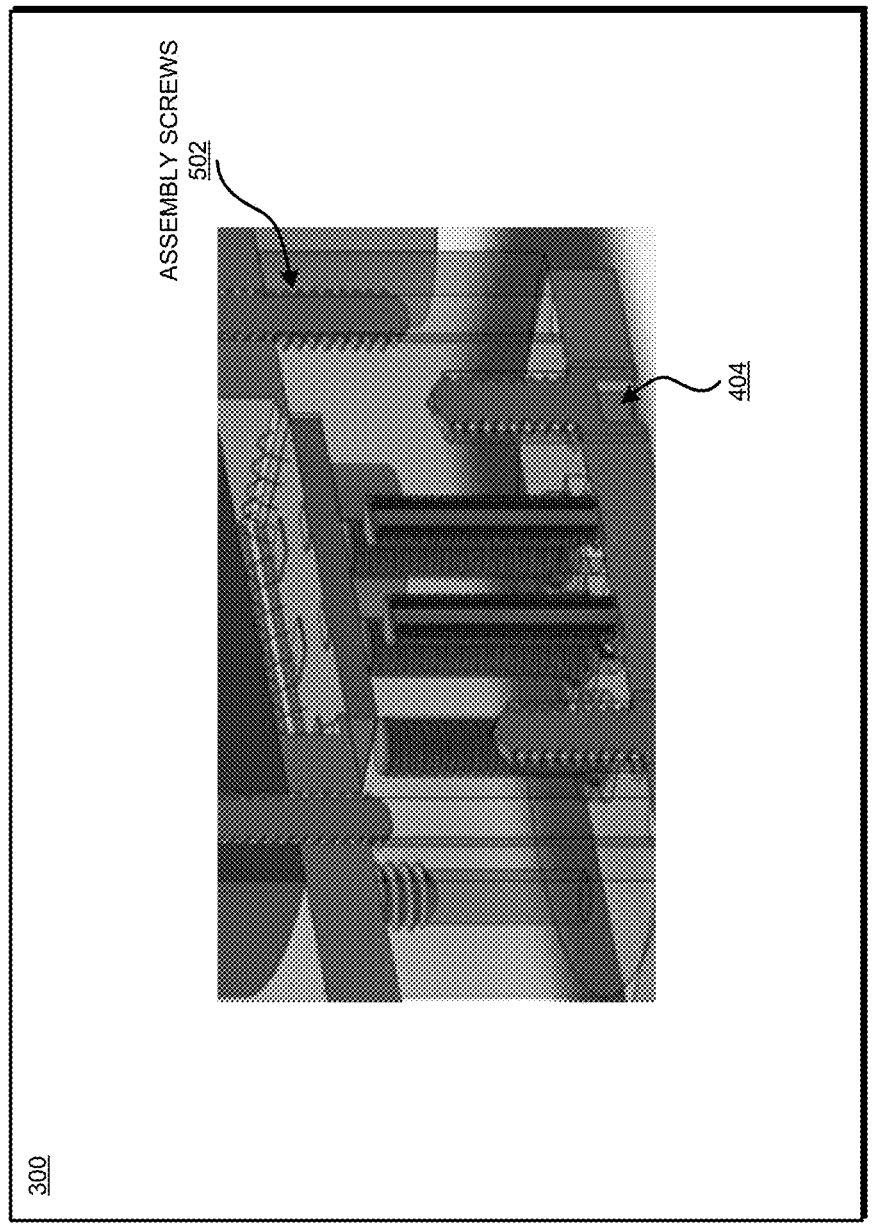
FIG. 9 depicts another view of an example implementation of L-Q pairs for flux biasing in superconducting quantum processors in accordance with an illustrative embodiment.

With reference to FIG. 9, this figure depicts another view of an example implementation of L-Q pairs for flux biasing in superconducting quantum processors in accordance with an illustrative embodiment. This view of configuration 300 shows an example non-limiting method of fastening platform structure 404, top cover 304 of FIG. 3, and bottom cover 306 of FIG. 3 together. Coils 508 of FIG. 5 are also visible in this figure.

Figure 10:
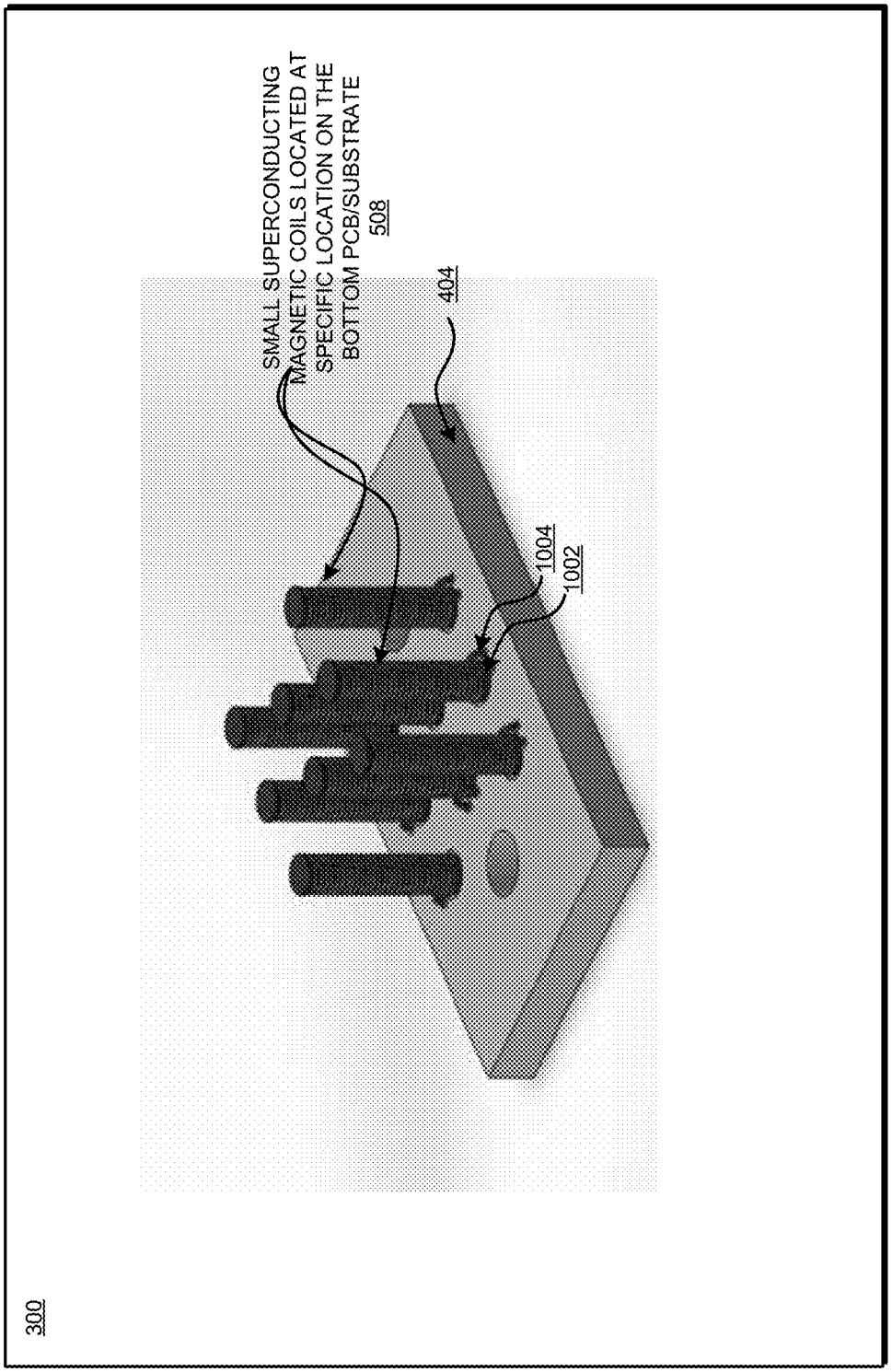
FIG. 10 depicts a view of an example connection between inductive members to multi-layer substrate or printed circuit board.

With reference to FIG. 10, this figure depicts another view of an example implementation of L-Q pairs for flux biasing in superconducting quantum processors in accordance with an illustrative embodiment. This view of configuration 300 shows an example non-limiting configuration of an example coil 508. Coils 508 are attached, affixed, or otherwise mounted on platform structure 404. Ends 1002 and 1004 of the superconducting wire of each coil 508 are suitably connected, bonded, wirebonded, or exposed to connect with contacts (not shown), which may be placed on the opposite side of platform structure 404.

Figure 11:
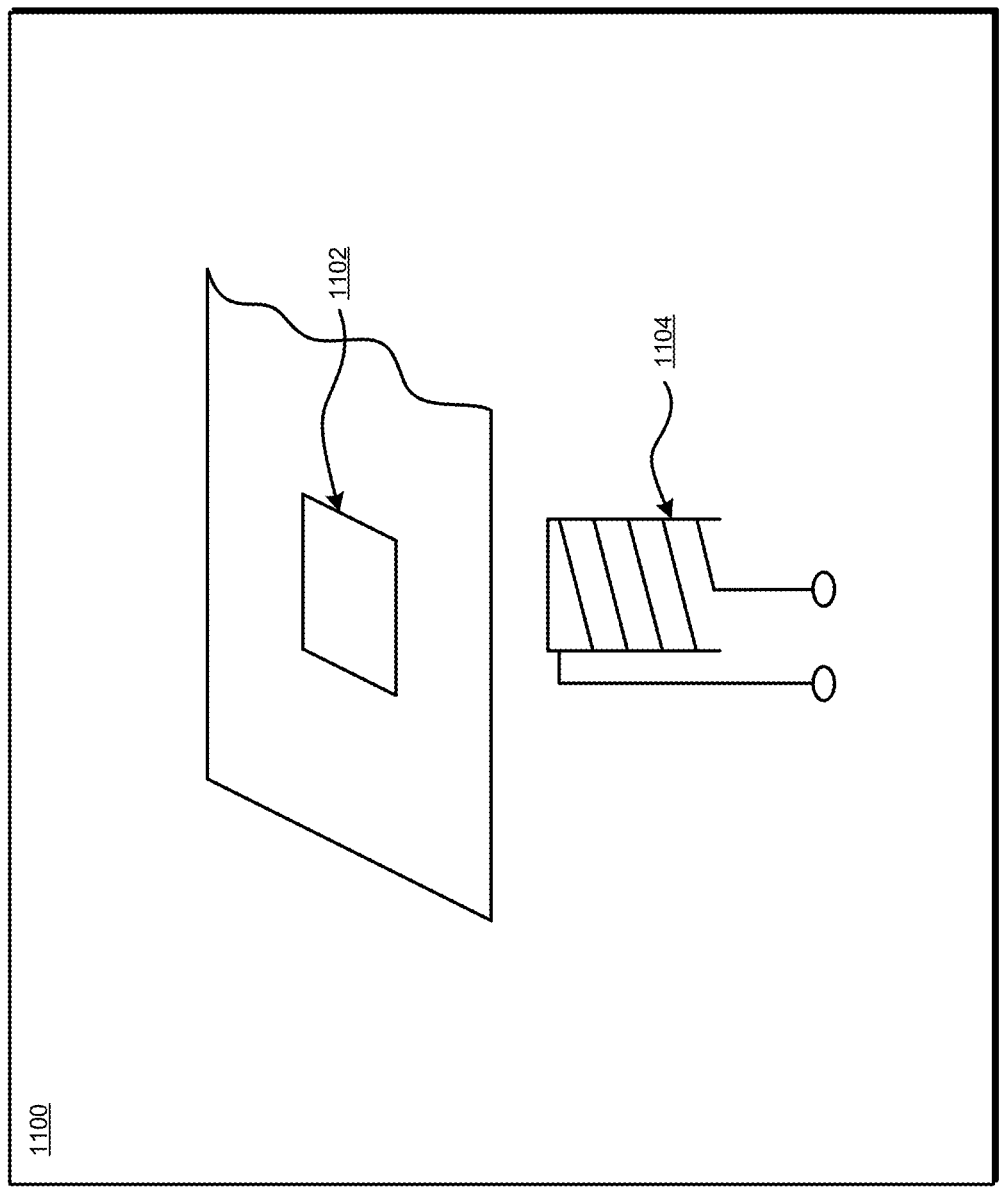
FIG. 11 depicts an example relative orientation of a coil and a qubit in an L-Q pair in accordance with an illustrative embodiment.

With reference to FIG. 11, this figure depicts an example relative orientation of a coil and a qubit in an L-Q pair in accordance with an illustrative embodiment. Configuration 1100 depicts a simplified block diagram of an example L-Q pair. In this configuration, qubit 1102 and coil 1104 are disposed relative to each other in a manner shown in FIGS. 3-10. Specifically, in this example orientation, coil 1104 is mounted under qubit 1102 and projects magnetic field lines up towards qubit 1102.

Figure 12:
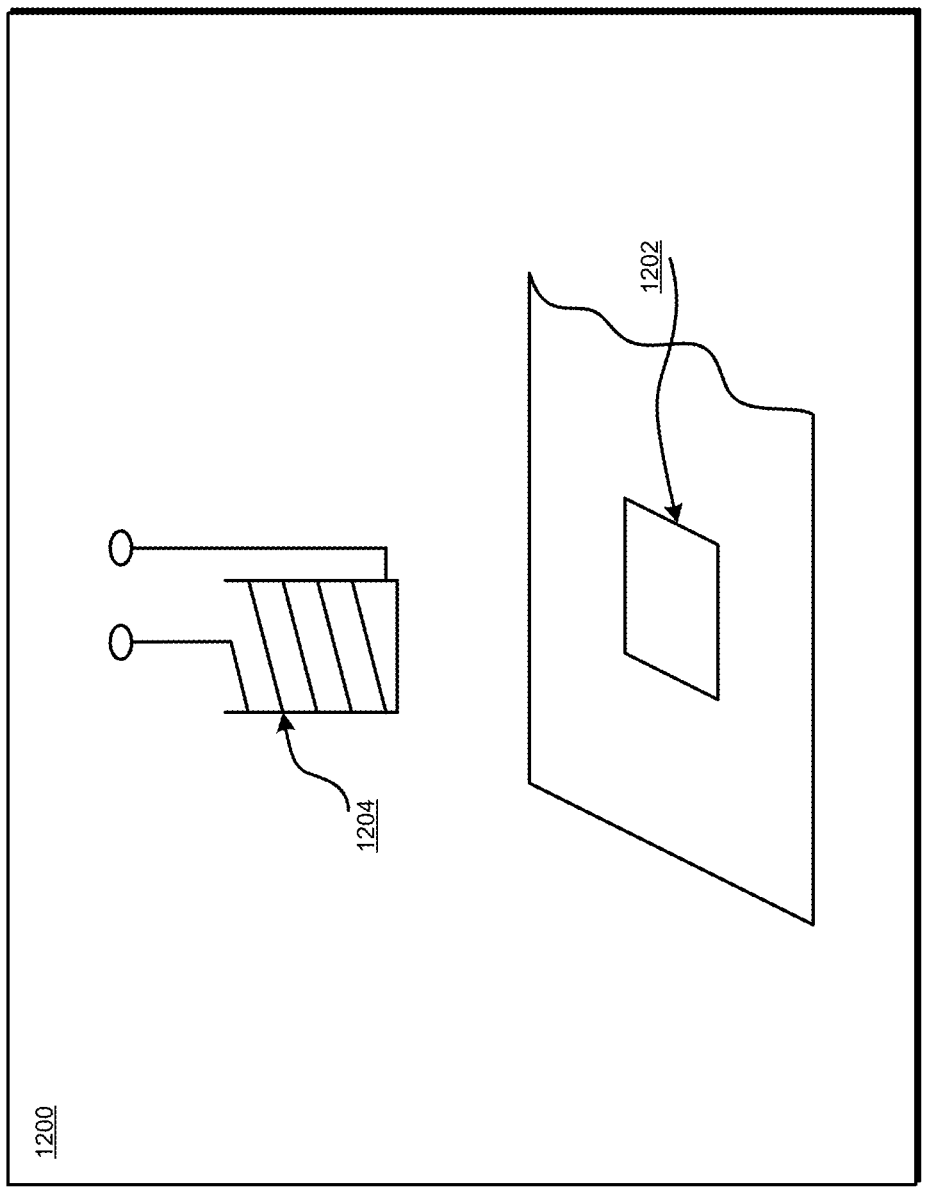
FIG. 12 depicts another example relative orientation of a coil and a qubit in an L-Q pair in accordance with an illustrative embodiment.

With reference to FIG. 12, this figure depicts another example relative orientation of a coil and a qubit in an L-Q pair in accordance with an illustrative embodiment. Configuration 1200 depicts a simplified block diagram of an example L-Q pair. In this configuration, coil 1204 is mounted above qubit 1202 and projects magnetic field lines down towards qubit 1202.

Figure 13:
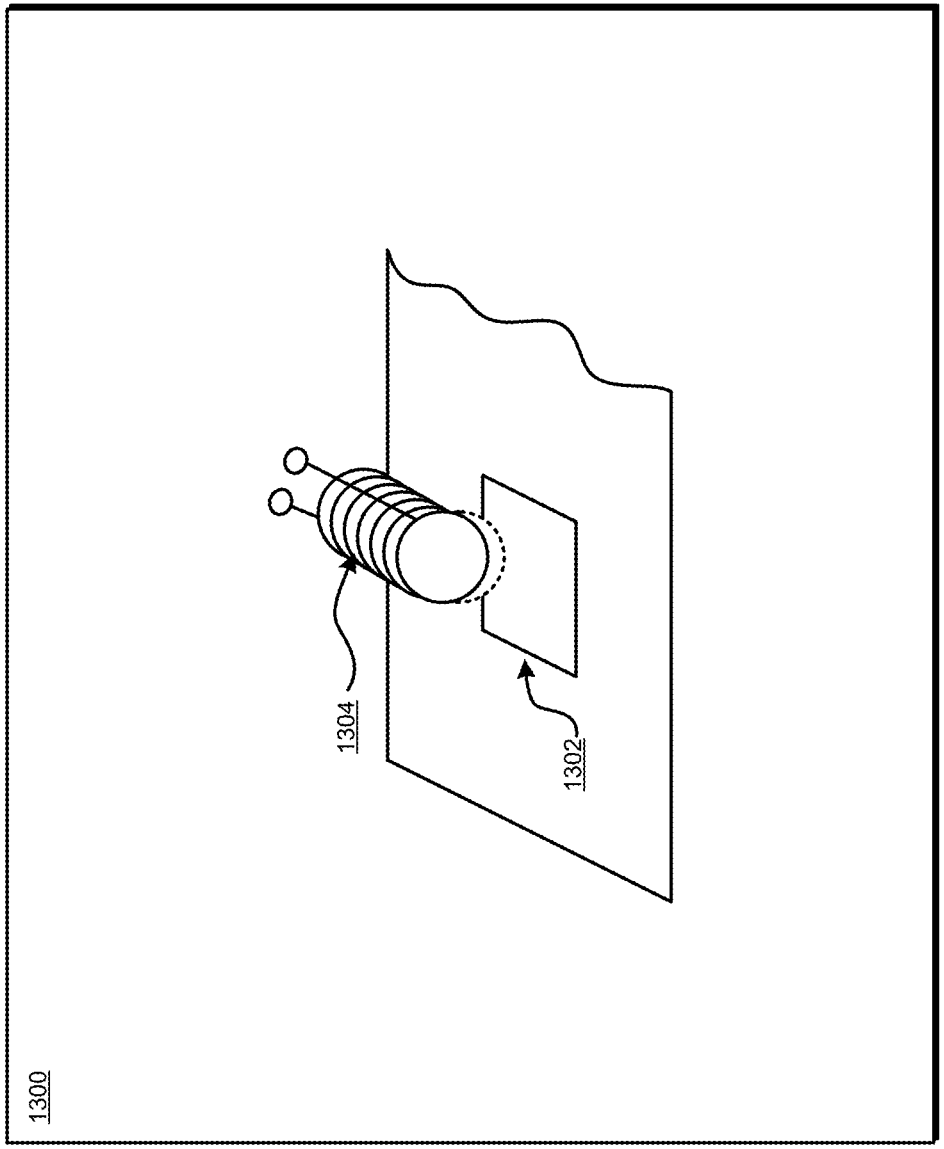
FIG. 13 depicts another example relative orientation of a coil and a qubit in an L-Q pair in accordance with an illustrative embodiment.

With reference to FIG. 13, this figure depicts another example relative orientation of a coil and a qubit in an L-Q pair in accordance with an illustrative embodiment. Configuration 1300 depicts a simplified block diagram of an example L-Q pair. In this configuration, coil 1304 is mounted substantially in parallel to qubit 1302—without contacting qubit 1302. Coil 1304 projects magnetic field lines substantially parallelly to the qubit 1302.

Figure 14:
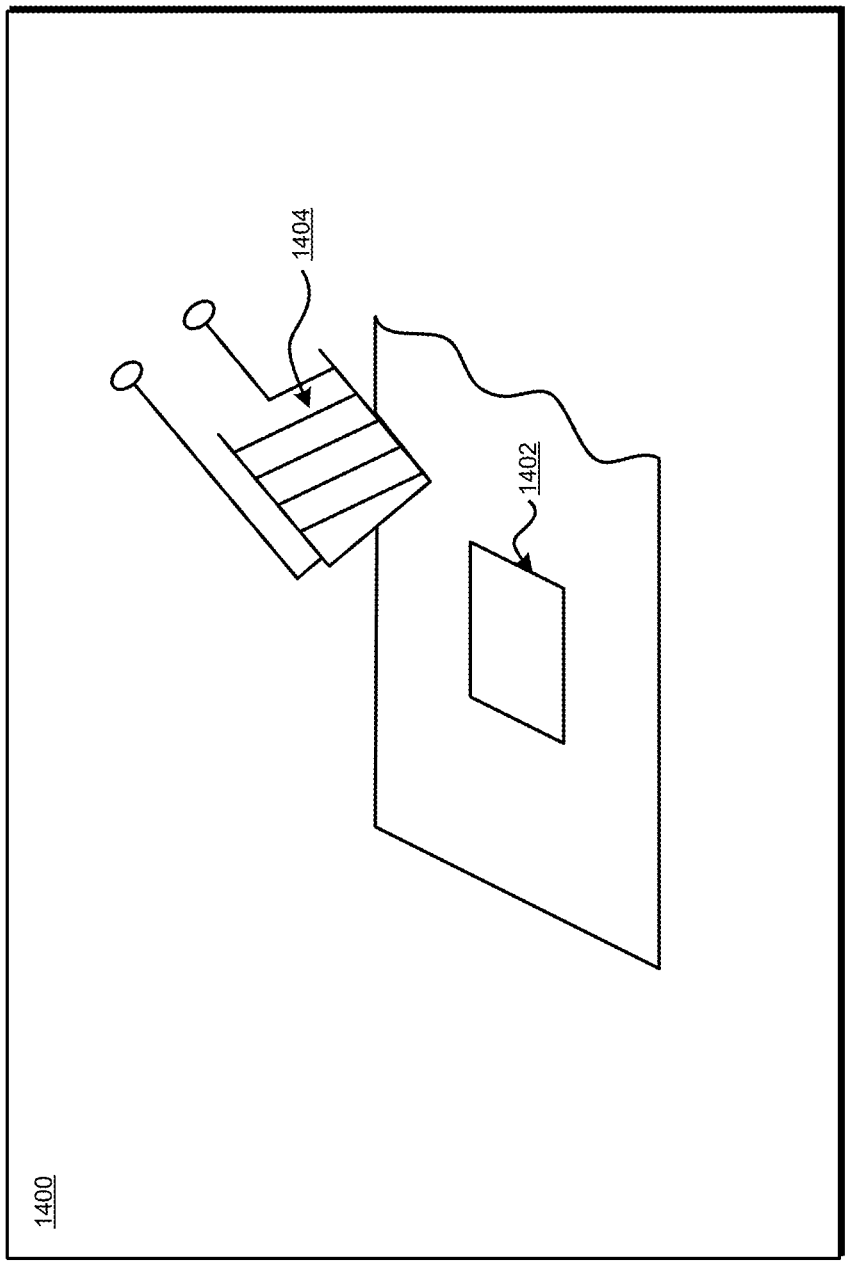
FIG. 14 depicts another example relative orientation of a coil and a qubit in an L-Q pair in accordance with an illustrative embodiment.

With reference to FIG. 14, this figure depicts another example relative orientation of a coil and a qubit in an L-Q pair in accordance with an illustrative embodiment. Configuration 1400 depicts a simplified block diagram of an example L-Q pair. In this configuration, coil 1404 is mounted at an angle relative to qubit 1402—without contacting qubit 1402. Coil 1404 projects magnetic field lines at an angle towards qubit 1402.

The orientations of FIGS. 13-14 or a similar orientation may not be desirable in the circumstance exemplified herein, but may be desirable under different circumstances. For example, if accessibility to a qubit package was to be obstructed in an implementation, and access was readily available in the qubit housing from a direction depicted in this figure, such an orientation could be used for flux biasing. These orientations may cause a greater interference with neighboring qubits in some cases, and may require special tooling or technique to fabricate.

Figure 15:
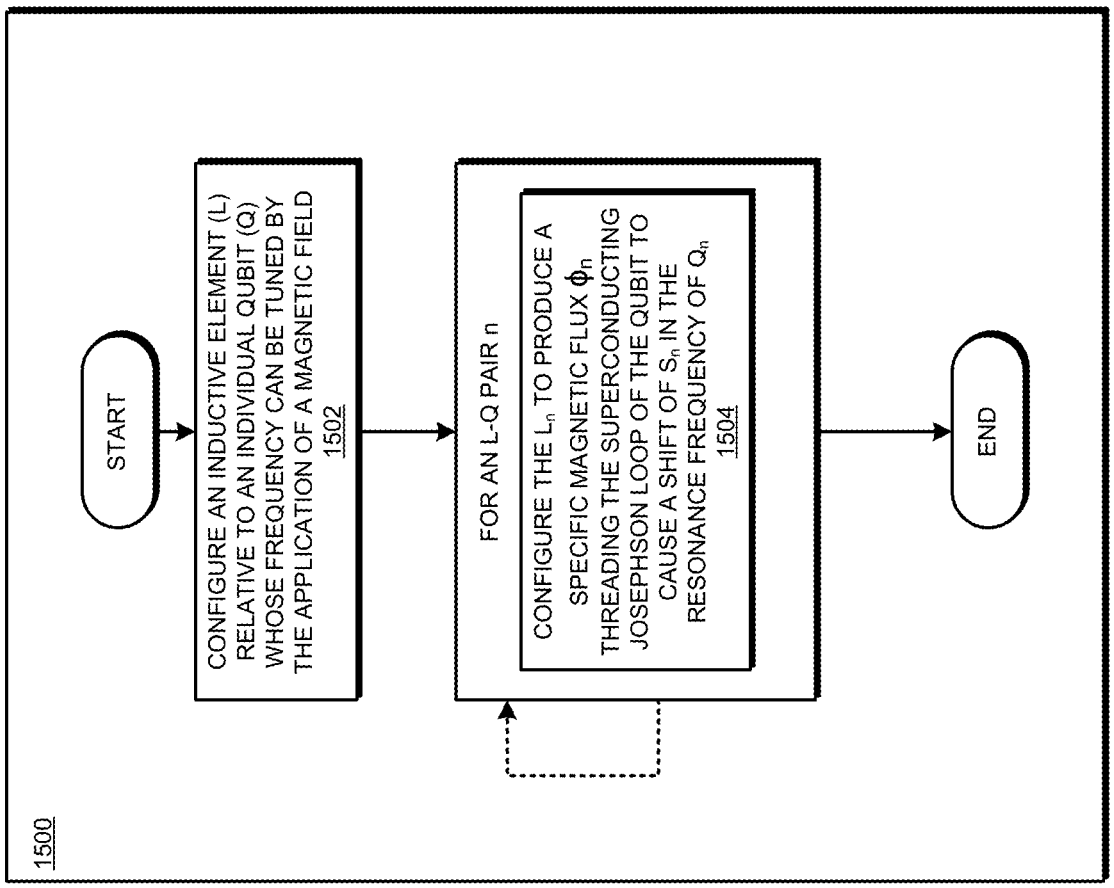
FIG. 15 depicts a flowchart of an example process of fabricating an apparatus for flux biasing in superconducting quantum processors in accordance with an illustrative embodiment.

With reference to FIG. 15, this figure depicts a flowchart of an example process of fabricating an apparatus for flux biasing in superconducting quantum processors in accordance with an illustrative embodiment. Process 1500 can be implemented in a fabrication system, e.g., in a software application that operates the fabrication system, to cause the described operations.

The embodiment configures an inductive element (L) relative to a qubit (Q) in a q-processor (block 1502). The embodiment configures a plurality of inductive elements—the qubit-specific coils described herein—relative to as many qubits whose resonance frequencies may be needed to be controlled in a given Q-processor chip.

For a given L-Q pair, the embodiment configures the inductive element L to produce a specific magnetic flux value Φ to cause a shift S in the microwave resonance frequency of the corresponding qubit Q (block 1504). The embodiment repeats block 1504 as many times as may be needed to configure various L-Q pairs in a given implementation. The embodiment ends process 1500 thereafter.

Figure 16:
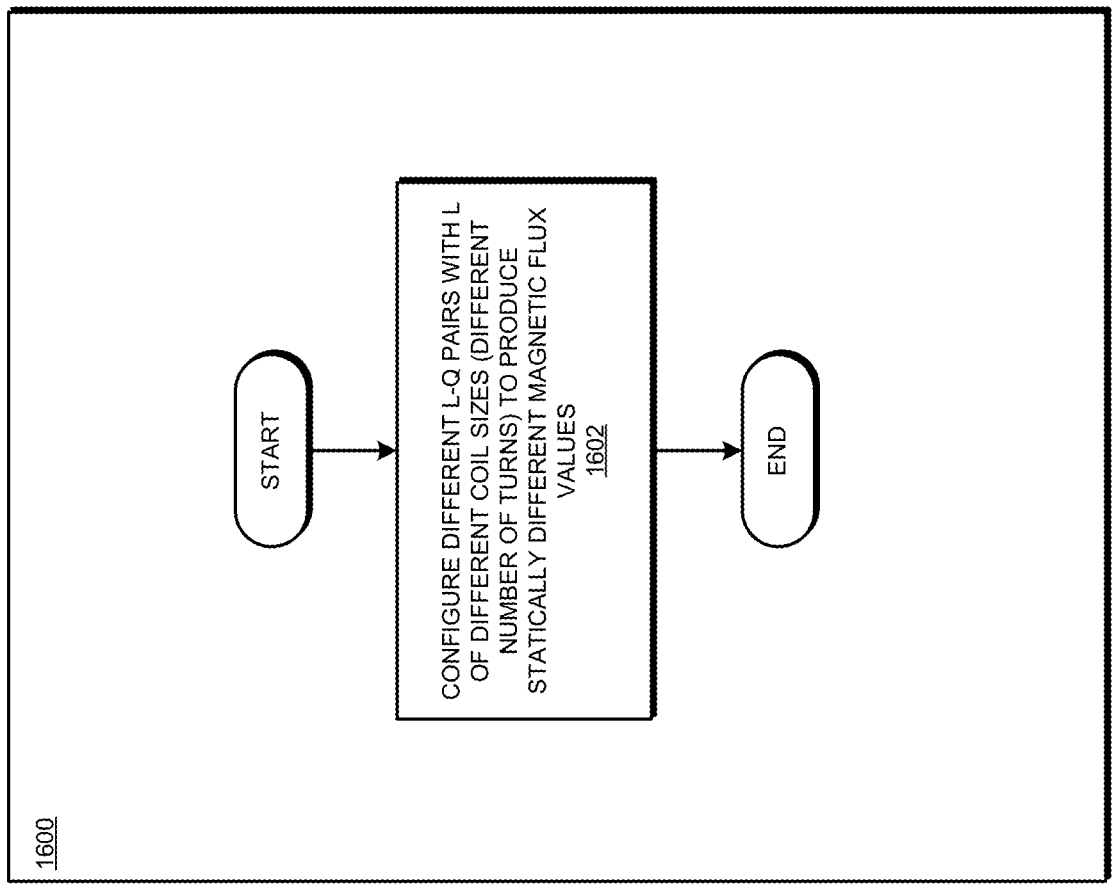
FIG. 16 depicts a flowchart of an example process of fabricating an apparatus for static flux biasing in superconducting quantum processors in accordance with an illustrative embodiment.

With reference to FIG. 16, this figure depicts a flowchart of an example process of fabricating an apparatus for static flux biasing in superconducting quantum processors in accordance with an illustrative embodiment. Process 1600 can be implemented as block 1504 in FIG. 15.

When a need exists for static shift in a qubit's resonance frequency, the embodiment configured an inductive element (L, qubit-specific coil) corresponding to that qubit with a predetermined number of coil turns, which would produce the desired value of magnetic flux at a predetermined electrical current value (DC), the magnetic flux causing the desired static shift in the resonance frequency of the qubit (block 1602). Different inductive elements can be statically configured to cause different static shifts in their respective qubits in a similar manner. The embodiment ends process 1600 thereafter.

Figure 17:
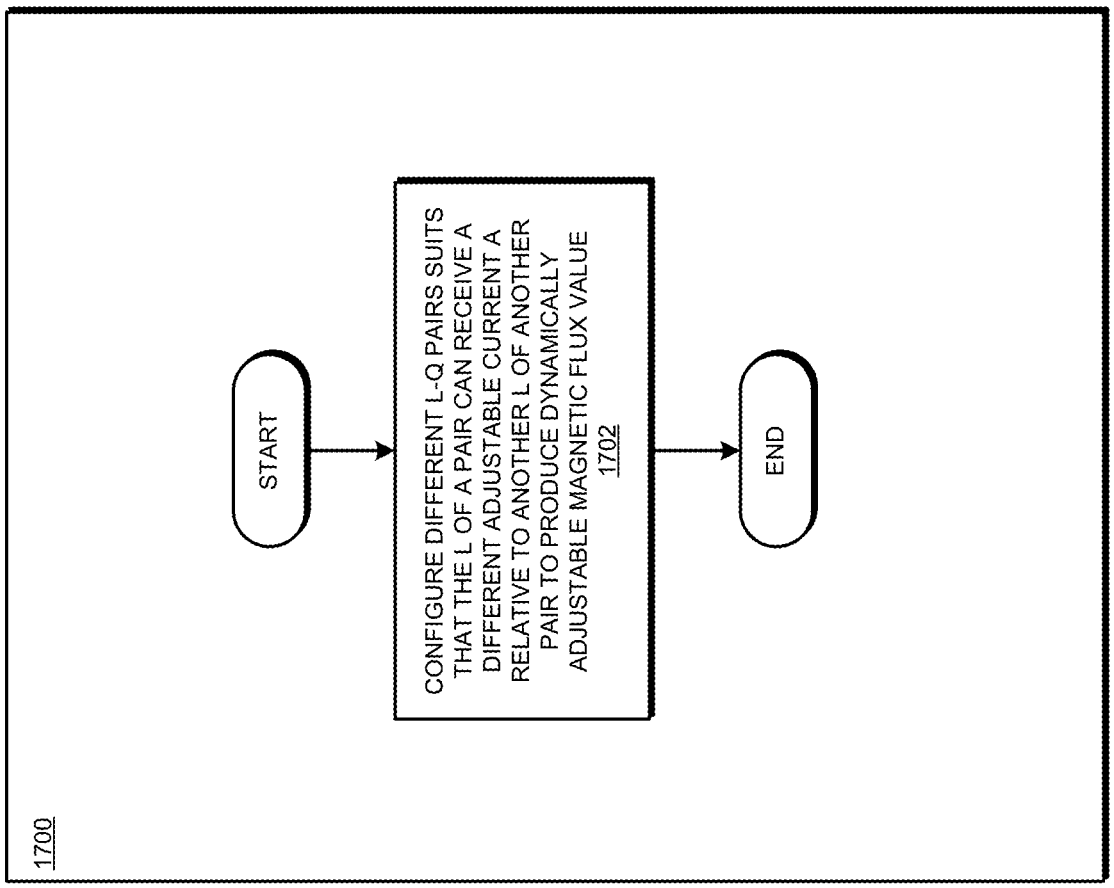
FIG. 17 depicts a flowchart of an example process of fabricating an apparatus for dynamic flux biasing in superconducting quantum processors in accordance with an illustrative embodiment.

With reference to FIG. 17, this figure depicts a flowchart of an example process of fabricating an apparatus for dynamic flux biasing in superconducting quantum processors in accordance with an illustrative embodiment. Process 1700 can be implemented as block 1504 in FIG. 15.

When a need exists for dynamically adjustable shift in a qubit's resonance frequency, the embodiment configured an inductive element (L, qubit-specific coil) corresponding to that qubit with individual connectors, which can receive dynamically adjustable electrical current value (DC), which cause an adjustable magnetic flux, the adjustable magnetic flux causing the desired adjustable shift in the resonance frequency of the qubit (block 1702). Different inductive elements can be dynamically configured to receive different currents causing different adjustable shifts in their respective qubits in a similar manner. The embodiment ends process 1700 thereafter.

Within the scope of the illustrative embodiments, it is contemplated that the amount of flux/magnetic field that the each coil can generate within the qubit loop, depend in general on—1) the number of turns of the superconducting wire wound around the core—the larger the number the larger the induced field; 2) the applied DC current through the wire—the larger the current, the larger the field; and 3) the distance between the near end of the coil and the qubit loop—the smaller the distance the larger the field.

Combinations of static and dynamic arrangements are contemplated within the scope of the illustrative embodiments. For example, different coils of different numbers of turns can receive variable current to cause different flux changes at different qubits. Such combinations and effects can be implemented without departing the scope of the illustrative embodiments.

The circuit elements of the flux-biasing apparatus and connections thereto can be made of superconducting material. Examples of superconducting materials (at low temperatures, such as about 10-100 millikelvin (mK), or about 4 K) include Niobium, Aluminum, Tantalum, etc. For example, the Josephson junctions are made of superconducting material, and their tunnel junctions can be made of a thin tunnel barrier, such as an aluminum oxide. The capacitors can be made of superconducting material separated by low-loss dielectric material. The transmission lines (i.e., wires) connecting the various elements can be made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A flux-biasing device comprising:
   a plurality of magnetic flux generating members (member);
   a detachable platform located external to a package and a housing that contains the package, the package comprising a plurality of qubits of a quantum processor, wherein the plurality of members are installed on the detachable platform, wherein
   a first member of the plurality of members is configured to magnetically interact with a first qubit in the plurality of qubits of the quantum processor by producing a first magnetic flux, and
   each non-corresponding member of the plurality of members is at least at a threshold distance from qubits corresponding to other members of the plurality of members such that qubits corresponding to the other members exhibit less than a threshold value of resonance frequency shift as a result of a magnetic flux of a non-corresponding member.

2. The device of claim 1, further comprising:
a housing encasing the package;
a fastening mechanism to detachably fasten the detachable platform to a removable cover of the housing, wherein of the first magnetic flux causes a first change in a first resonance frequency of the first qubit by a first frequency shift value, and wherein the fastening mechanism disposes the first member within an influence distance of the first qubit, wherein the influence distance causes the first frequency shift value to be greater than the threshold value.

3. The device of claim 1, wherein the first member is separated from the first qubit by a first gap, the gap being occupied by at least one from a group comprising (i) partial vacuum and (ii) a solid.

4. The device of claim 1, further comprising:
a wire of a superconducting material, the wire being formed into a coil around a conductive core, the coil and the core together forming the first member, the first member being configured to produce the first magnetic flux when supplied with a direct current.

5. The device of claim 4, further comprising:
an insulating layer covering the wire; and
a metallic contact, wherein the contact forms an electrical connection between the wire and at least one from a group comprising (i) a layer of the detachable platform and (ii) a substrate.

6. The device of claim 4, wherein the first member produces the first magnetic flux while operating in a range of temperatures between 4 degrees Kelvin and 0.0001 degrees Kelvin.

7. The device of claim 1, further comprising:
an orientation of the first member relative to the first qubit, wherein the orientation comprises positioning the first member with a cylindrical axis of the first member being orthogonal to a plane of fabrication of the first qubit, with the first member is situated below the plane of fabrication.

8. The device of claim 1, further comprising:
an orientation of the first member relative to the first qubit, wherein the orientation comprises positioning the first member with a cylindrical axis of the first member being orthogonal to a plane of fabrication of the first qubit, with the first member is situated above the plane of fabrication.

9. The device of claim 1, further comprising:
an orientation of the first member relative to the first qubit, wherein the orientation comprises positioning the first member with a cylindrical axis of the first member being at a non-orthogonal angle to a plane of fabrication of the first qubit, with the first member is situated below the plane of fabrication.

10. The device of claim 1, further comprising:
a one-to-one correspondence between the first member and the first qubit.

11. The device of claim 1, further comprising:
an n-to-one correspondence between more than one members of the plurality of members and the first qubit.

12. The device of claim 1, further comprising:
a second member of the plurality of members is configured to magnetically interact with a second qubit in the plurality of qubits of the quantum processor such that a second magnetic flux of the second member causes a second change in a second resonance frequency of the second qubit by a second frequency shift value, and wherein
the second member is located at such a distance from the first qubit such that the first resonance frequency of the first qubit remains stable within a tolerance regardless of the second member.

13. The device of claim 1, further comprising:
a pair of connectors coupled to the first member, wherein changing a value of a direct current passing through the pair of connectors causes a corresponding change in a first frequency shift value of the first qubit.

14. The device of claim 1, further comprising:
a first number of coil turns in the first member;
a second number of coil turns in a second member of the plurality of members.

15. The device of claim 1, wherein the plurality of members is positioned outside a housing that contains the plurality of qubits, and wherein the plurality of members is removable via one cover of the housing.

16. The device of claim 1, wherein the plurality of members is thermalized to a dilution fridge stage through a housing that contains the plurality of qubits.

17. The device of claim 1, wherein a cylindrical axis of each member is aligned with a center of a superconducting loop of a corresponding qubit from the plurality of qubits.

18. The device of claim 1, further comprising:
a filtering circuit fabricated in conjunction with the plurality of members, wherein the filtering circuit filters an electrical noise carried by the plurality of members.

* * * * *